United States Patent
Boyd et al.

[11] Patent Number: 6,127,771
[45] Date of Patent: Oct. 3, 2000

[54] MULTI-LAYER PIEZOELECTRIC TRANSFORMER MOUNTING DEVICE

[75] Inventors: Clark Davis Boyd, Hampton; Richard Patten Bishop, Fairfax Station, both of Va.

[73] Assignee: Face International Corp., Norfolk, Va.

[21] Appl. No.: 09/172,905

[22] Filed: Oct. 15, 1998

[51] Int. Cl.[7] ............................................. H01L 41/08
[52] U.S. Cl. .............................. 310/359; 310/352
[58] Field of Search .......................... 310/348, 352, 310/359

[56] References Cited

U.S. PATENT DOCUMENTS

| | | | |
|---|---|---|---|
| 5,747,916 | 5/1998 | Sugimoto et al. | 310/348 |
| 5,834,882 | 11/1998 | Bishop | 310/359 |
| 5,929,553 | 7/1999 | Suzuki et al. | 310/355 |

FOREIGN PATENT DOCUMENTS

| | | | |
|---|---|---|---|
| 42-24576 | 10/1968 | Japan | 310/352 |
| 44-12506 | 6/1969 | Japan | 310/352 |
| 54-100682 | 8/1979 | Japan | 310/352 |
| 55-635 | 1/1980 | Japan | 310/348 |

*Primary Examiner*—Thomas M. Dougherty
*Attorney, Agent, or Firm*—Stephen E. Clark; David J. Bolduc

[57] ABSTRACT

A contact device for securely and reliably attaching electrical leads to a laminated multi-layer piezoelectric transformer and comprising a pair of conductive lead attachment plates, disposed on opposite sides of the laminated multi-layer piezoelectric transformer, each having first and second surfaces, the first surface having at least one leg extending therefrom to contact the laminated multi-layer piezoelectric transformer at a node and the second surface being sufficient to permit secure and durable attachment of electrical leads thereto. A variety of geometric configurations of the contact device of the present invention suitable or adaptable to a variety of laminated multi-layer piezoelectric transformer geometries are also described. Such a device, useful for the attachment of a laminated multi-layer piezoelectric transformer to a circuit board, is also described.

7 Claims, 3 Drawing Sheets

MULTI-LAYER PIEZOELECTRIC TRANSFORMER MOUNTING DEVICE

FIELD OF THE INVENTION

The present invention relates to devices for easily and securely mounting multi-layer piezoelectric transformers. More specifically it relates to a mounting device which permits durable incorporation of such transformers into, for example, printed circuitry with a minimum of processing steps.

BACKGROUND OF THE INVENTION

Wound electromagnetic transformers are well known in the art. The problems with miniaturizing them are similarly well known. To address these problems, piezoelectric transformers utilizing the piezoelectric effect of certain ceramic materials, which can be made much smaller, especially to handle relatively low voltages, have been designed and manufactured. Additionally, piezoelectric transformers are non-flammable and produce no electromagnetically induced noise.

A variety of physical configurations of piezoelectric transformers have been designed and manufactured, including rings, circles, flat slabs and the like. One of the best known of such transformers is the so-called "Rosen" type. The basic Rosen-type piezoelectric transformer was disclosed in U.S. Pat. No. 2,830,274 to Rosen, and numerous versions and variations of this basic apparatus are well known in the art. The typical Rosen-type transformer comprises a flat slab of ceramic that is appreciably longer than it is wide and substantially wider than it is thick. Activation of the transformer is achieved by differentially poling the ceramic the ceramic slab and attaching electrical leads to the major and minor faces of the ceramic slab to obtain electrical input thereto and output therefrom. The attachment of electrical leads to the faces of such devices by soldering or otherwise has always been a problem in the manufacturing process. Since the Rosen type transformer undergoes deformation in use, the durable attachment of leads is particularly vexing.

In order to overcome many of the problems inherent with the Rosen type piezoelectric transformer, including the need for dual poling, laminated piezoelectric transformers comprising two ceramic slabs separated by a series of metallic sheets bonded to the ceramic slab have been proposed.

A device of this type is depicted in FIG. 1 wherein a first piezoelectric wafer 30 is has two substantially parallel faces 32 and 38 that are electroplated. A second piezoelectric wafer 48 has two substantially parallel, electroplated faces 46 and 50. A first, typically pre-stressed, layer 36 is positioned adjacent electroplated surface 32. An adhesive layer 34 is disposed between the first layer 36 and adjacent electroplated surface 32 of wafer 30 for purposes of bonding the two members together. The first pre-stressed layer 36 is typically a metal having a coefficient of thermal expansion/contraction greater than that of the material of ceramic wafer 30.

A second pre-stress layer 42 is positioned adjacent the other electroplated surface 38 of wafer 30. An adhesive layer 40 is disposed between the second pre-stress layer 42 and the adjacent electroplated surface 38 of ceramic wafer 30 for purposes of bonding the two members together. The second pre-stress layer 42 is typically a metal having a coefficient of thermal expansion/contraction which is greater than that of ceramic wafer 30.

Electroplating 46 of second ceramic wafer 48 is positioned adjacent second pre-stress layer 42 such that layer 42 is between ceramic wafers 30 and 48. An adhesive layer 44 is disposed between pre-stress layer 42 and electroplated surface 46for purposes of bonding the two members together. Pre-stress layer 36 typically has a coefficient of thermal expansion/contraction greater than that of ceramic wafer 48.

A third pre-stress layer 54 is positioned adjacent the other electroplated surface 50 of ceramic wafer 48. Adhesive layer 52 is disposed between the third pre-stress layer 54 and the adjacent electroplated surface 50 of ceramic wafer 48 for purposes of boding the two members together. The third pre-stress layer 54 is typically a metal having a coefficient of thermal expansion/contraction which is greater than that of ceramic wafer 48.

After fabrication of the transformer device, ceramic wafers 30 and 48 are poled in one direction, such that when a voltage is applied across electrodes 46 and 50 or 32 and 38, the wafer will strain longitudinally. Conversely, the application of longitudinal strain to poled ceramic wafers 30 and 48 results in the generation of voltage between corresponding electrodes 46 and 50 or 32 and 38.

When a primary, or "input", voltage is applied across electrodes 32 and 38, poled ceramic wafer 30 piezoelectrically generates an extensional stress commensurate with the magnitude of the input voltage Vl. The extensional stress generated by input voltage Vl causes ceramic wafer 30 to be strained as indicated by arrow 64, which, in turn, causes ceramic wafer 48 to strain , as indicated by arrow 65, which, in turn, piezoelectrically generates a voltage V2 across electroplated surfaces 46 and 50.

At resonant frequency, the occurrence of this strain, as is clear to the skilled artisan, causes a significant deformation in the composite structure, as the voltage cycles from positive to negative. This deformation, even at a normal 60 cycles, results in significant strain and vibrational energy which is, in turn, translates into a strain on and subsequent fatigue degradation of the joints 51, 53, and 55 where the electrical leads 56, 58 and 60 are attached by soldering or otherwise. In fact, it has proven very difficult to design and implement a reliable and durable lead attachment system for such multi-layer resonating piezoelectric transformers that can withstand such strain over a long period of time.

Furthermore, because of the design of this type of very efficient transformer, as with the Rosen type transformer, it is difficult to incorporate the transformer into a printed circuit board with any degree of reliability.

OBJECTS OF THE INVENTION

It is therefore an object of the present invention to provide a durable and reliable contact device for such laminated multi-layer piezoelectric transformers.

It is a further object of the present invention to provide such a contact device that is easy to use and is readily adaptable to permit easy installation of such multi-layer piezoelectric transformers into conventional circuit boards.

Further objects and advantages will become apparent from a consideration of the ensuing description and drawings.

DESCRIPTION OF THE DRAWINGS

The invention will be more fully understood from the following detailed description taken in conjunction with the accompanying drawings, which form part of this application and wherein.

DETAILED DESCRIPTION

As described herein above, the laminated multi-layer piezoelectric transformers of the prior art undergo significant strain and vibration in use as they flex under the influence of applied voltage. Such flexure and the concomitant induced fatigue of electrical lead attachments has been a vexing problem that has adversely affected the ability to utilize such devices in applications where they will undergo large numbers of flexural cycles in the course of their useful "lives". Additionally, such devices can be configured in any number of geometric shapes depending upon the particular use to which they are put, and the type and amount of energy they are expected to handle. For example, rectangular, round and ring-shaped shapes have been proposed for differing applications. Whatever geometric shape is used, there may be a problem of flex-induced fatigue as it relates to the ability to easily and reliably attach electrical leads to the device. Such problems are enhanced in such devices that are geometrically symmetrical and operating at natural (resonant) frequencies, as the magnitude of deformation may be many times greater than in asymmetric non-resonating devices.

In most applications of multi-layer, parallel-poled piezoelectric transformers, the devices will be designed such that, for the particular application, a specific device of the proper geometric configuration, which operates at its resonant frequency (its optimum or most efficient frequency) will be used. As will be described more fully hereinafter, this is fortuitous, since a properly designed laminated multi-layer piezoelectric transformer operating at its resonant frequency based on a consistent AC voltage input will always flex in the same manner and, therefore, have its node(s) at predictable position(s).

Figure 1:
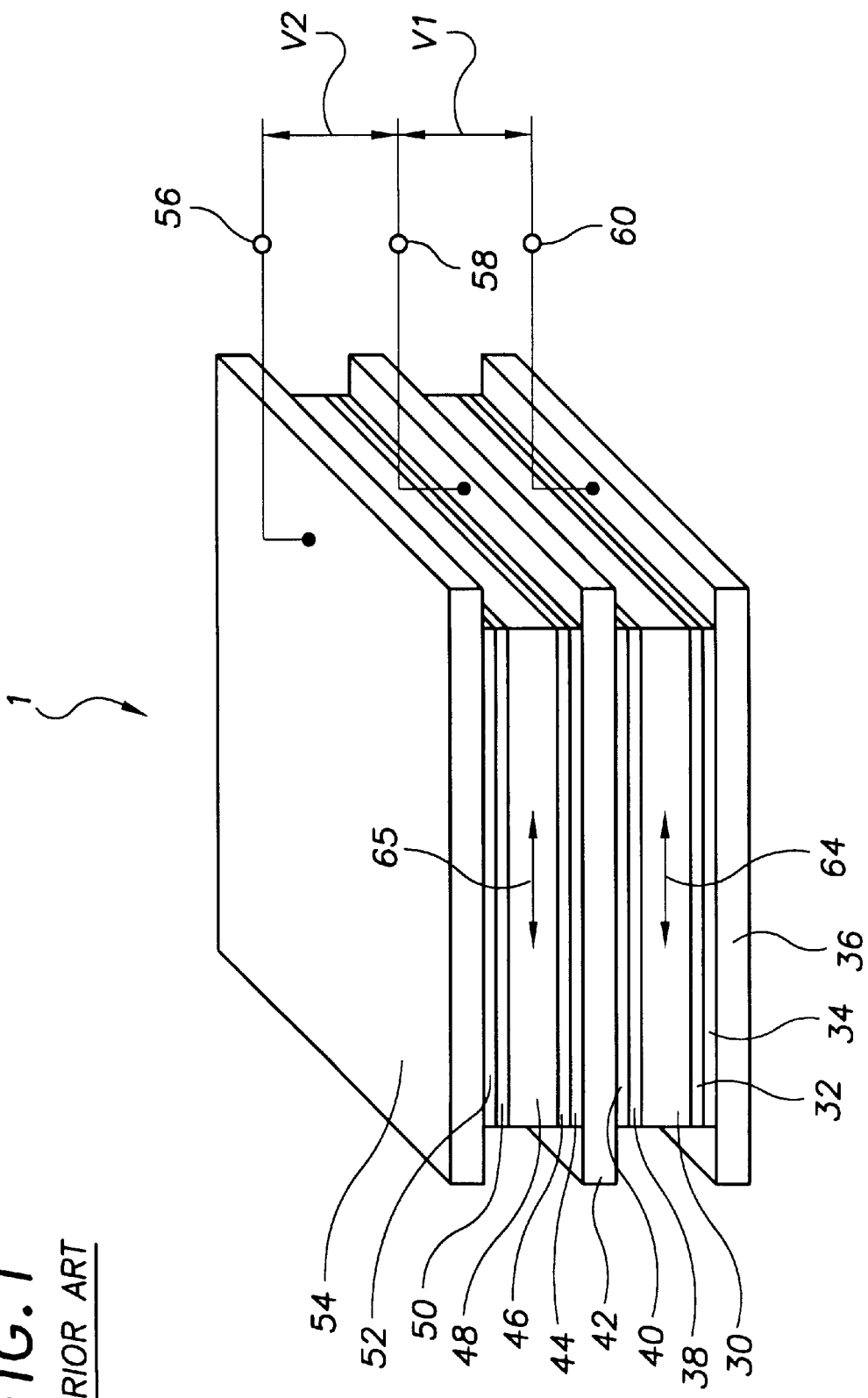
FIG. 1 is a perspective view of a piezoelectric transformer device of the prior art of the type with which the contact device of the present invention is particularly useful.
Figure 2:
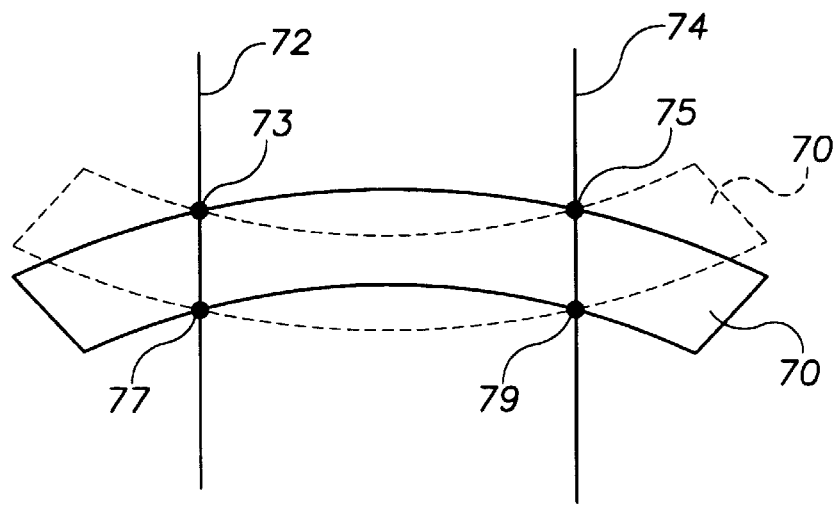
FIG. 2 schematically shows the flexing which a laminated multi-layer piezoelectric transformer undergoes upon the application of alternating voltage.

This is best depicted in FIG. 2, wherein a multi-layer, parallel-poled piezoelectric transformer 70, depicted in solid lines in one phase of its vibration cycle and in dotted lines in the reverse phase of its cycle, will always flex about points (i.e. nodes) located along lines 72 and 74 when oscillated at transformer's 70 resonant frequency. Recognition of this phenomenon permits the design of the a contact device, by which electrical power may be conveniently brought to the transformer and by which the transformer may be physically secured to electrical circuit components, can be of relatively simple construction and easily installed.

Figure 3:
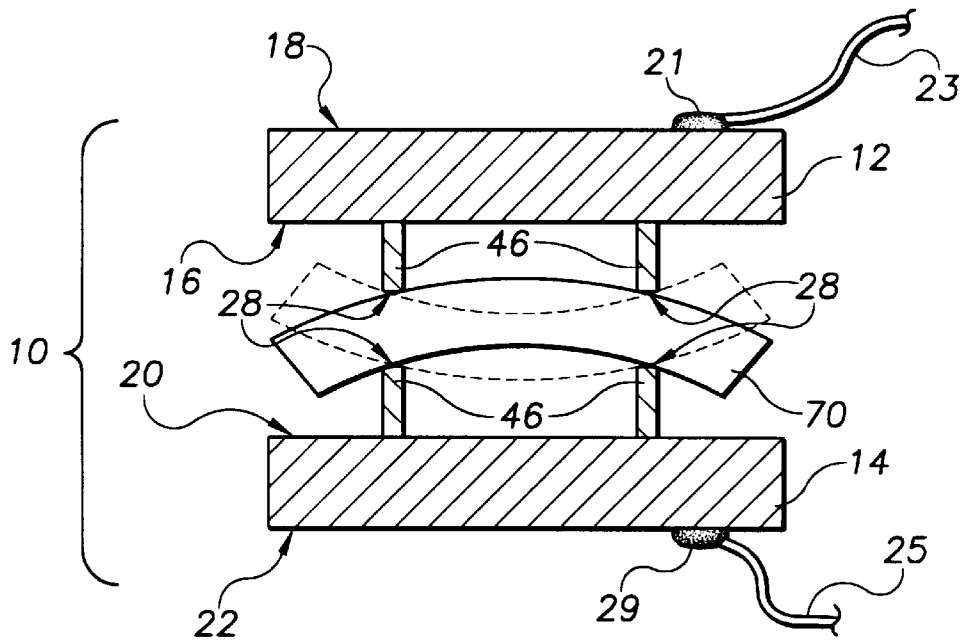
FIG. 3 is a cross-sectional view of one embodiment of the contact device of the present invention in use with a multi-layer piezoelectric transformer.

As shown in FIG. 3, electrical contact at points 73, 75, 77 and 79 undergo minimum movement during flexing of the multi-layer, parallel-poled piezoelectric transformer 70, and, therefore, provide a relatively stable locations for attachment of electrical contacts and mounting hardware. Furthermore, it will be appreciated that the multi-layer, parallel-poled piezoelectric transformer 70 may be physically secured at those points (73, 75, 77 and 79) without significantly restriction the resonant frequency oscillation of the multi-layer, parallel-poled piezoelectric transformer 70. Consequently, physical connections made at these points are subject to minimal stress and fatigue during use.

The points on the surface of such a multi-layer, parallel-poled piezoelectric transformer 70 that undergo minimum movement during resonant frequency flexing is hereinafter referred to as "nodes".

According to the present invention, there is provided a contact device (generally designated 10 in the drawings) for securely and reliably attaching electrical leads to a multi-layer, parallel-poled piezoelectric transformer 70. The contact device 10 comprises a pair of conductive lead attachment plates 12 and 14 each having first and second surfaces, the first surface having at least one leg 46 extending therefrom to contact the laminated multi-layer piezoelectric transformer at a node and the second surface being sufficient to permit secure and durable attachment of electrical leads thereto. A variety of geometric configurations of the contact device 10 of the present invention suitable or adaptable to a variety of laminated multi-layer piezoelectric transformer geometries are also described. Such a device, useful for attachment of a laminated multi-layer piezoelectric transformer to a circuit board, is also described.

As shown in FIG. 3, the contact device 10 of the present invention comprises a pair of conductive lead attachment plates 12 and 14 having first and second surfaces 16 and 18, and 20 and 22, respectively. First surfaces 16 and 20 each have legs 46 extending therefrom to contact opposing surfaces of multi-layer, parallel-poled piezoelectric transformer 70 at node(s) 28. In the embodiment shown in FIG. 3, multi-layer, parallel-poled piezoelectric transformer 70 is rectangular in plan view (i.e. perpendicular to the plane of the drawing page), hence two legs 46 extend from each of conductive lead attachment plates 12 and 14. This is merely a matter of accommodation or choice, and, as will be shown hereinafter, depending upon the geometry of the laminated multi-layer piezoelectric transformer, any number of such legs, from one to a multitude may be used, and it is well within the skill of the artisan, given the instant disclosure, to select the appropriate number of such legs for any particular geometry.

Conductive lead attachment plates 12 and 14 and legs 46 may be of the same or different materials; however, they must be electrically conductive and sufficiently resilient or strong as to withstand the stresses that will be applied to them in use. Metals have been useful for these components. It should be apparent, however, that the stress applied to the lead attachment points 21 and 29 on the surfaces 18 and 22 of lead attachment plates 12 and 14, respectively, is considerably less than that which would be applied if an attempt were made to attach such leads directly to exposed surfaces of the transformers, as has been previously done.

At those points, nodes 28, where legs 46 contact the surface of multi-layer, parallel-poled piezoelectric transformer 70, it is of course advisable to use some sort of attachment mechanism to secure legs 46 thereto. Any suitable method may be used for this purpose, so long as the operating capabilities of the device are not affected. For example, soldering or gluing with a suitable conductive adhesive have been found useful. Alternatively, some type of simple non-conductive pressure device that applies adequate pressure, equally and directly to surfaces 18 and 20, can be used to maintain contact between the surfaces of the multi-layer, parallel-poled piezoelectric transformer 70 and the distal ends of the legs 46. For example, a non-conductive spring device (not shown) mounted across the gap between surfaces 18 and 22 could provide such adequate pressure as to maintain intimate and conductive contact between legs 46 and nodes 28. Any such device must, of course, be such as to not inhibit the inherent movement that the multi-layer, parallel-poled piezoelectric transformer 70 undergoes during use.

Leads 23 and 25 may be attached to lead attachment plates 12 and 14 at any point on the surface thereof, (indicated as attachments points 21 and 29 in the embodiment depicted in FIG. 3), using any suitable attachment method, including soldering, ultrasonic welding, adhesion with a conductive adhesive, etc.

The shape of the distal ends of legs 46 is also largely a matter of design choice. For example, in the case where a non-conductive spring arrangement is used to bias the two attachment plates 12 and 14 toward each other, small radius or pointed leg ends might be called for, while in the case of a soldered or glued joint, a flat or high radius leg end might be adequate. Whatever end geometry is selected for legs 46, the smaller the area of the point of contact of legs 46 with nodes 28, the less likely there will be fatigue failure, because the stresses applied at the point of contact by flexing of transformer 70 can be more easily restricted to the area of the nodes 28 (i.e. the area of minimum displacement). So long as adequate voltage is conducted from the legs 46 to the nodes 28 as to induce operation of the transformer 70, (i.e. to allow conductance of voltage into and out of the transformer), the leg configuration and geometry may be varied broadly.

Figure 5:
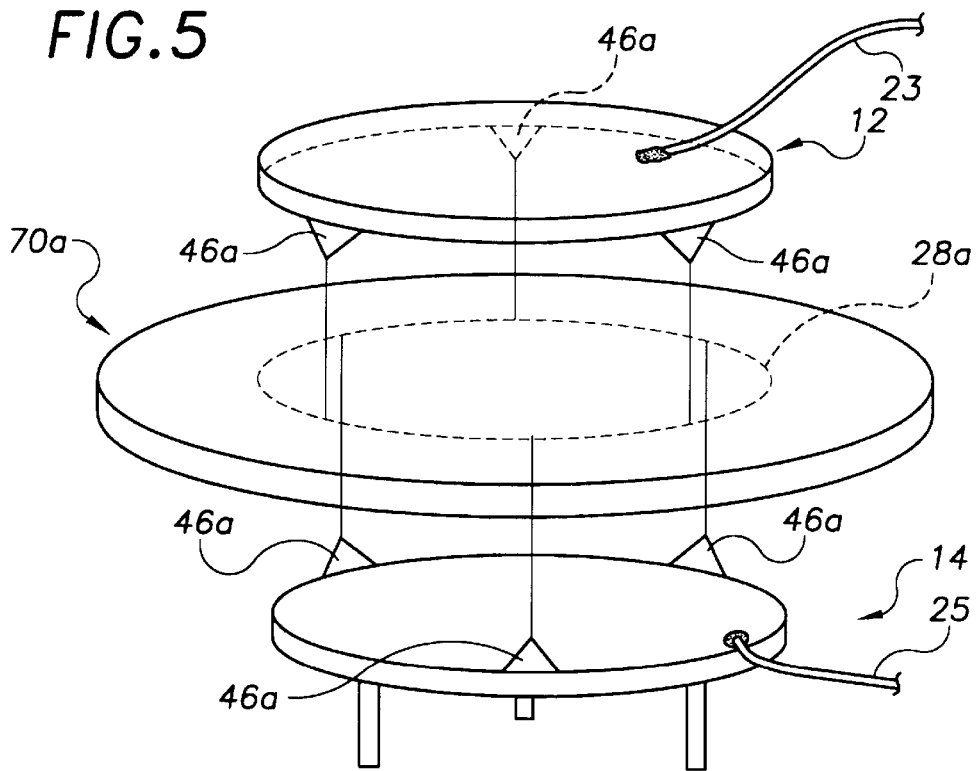
FIG. 5 is an exploded view of another embodiment of the contact device of the present invention showing how such a device would be used with an alternative configuration of laminated multi-layer piezoelectric transformer.

FIG. 5 depicts the case where the multi-layer, parallel-poled piezoelectric transformer 70a is circular, or "disc" shaped. In this instance, the transformer 70a will flex at resonance about a circular node 28a. Thus, in this embodiment of the invention it is desirable that a plurality of legs 46 be configured in a circular pattern (i.e. corresponding to the diameter/pattern of the node 28a). In this case, a plurality of pointed legs 46a that engage node 28a can be used. Alternatively, a continuous leg having a narrow width, circular (or circle segment) footprint whose diameter corresponds to the diameter of the node 28 pattern in the multi-layer, parallel-poled piezoelectric transformer 70a could be used. Similar fastening of legs 46a with adhesive, solder or some other mechanism may be used.

Whatever geometry of lead attachment plate legs (46 or 46a) is used, leads 23 and 25 can be attached to the second surface thereof, i.e. the surface opposite that from which the legs (46 or 46a) extend, in any conventional fashion such as soldering, welding, adhesion or otherwise.

Figure 4:
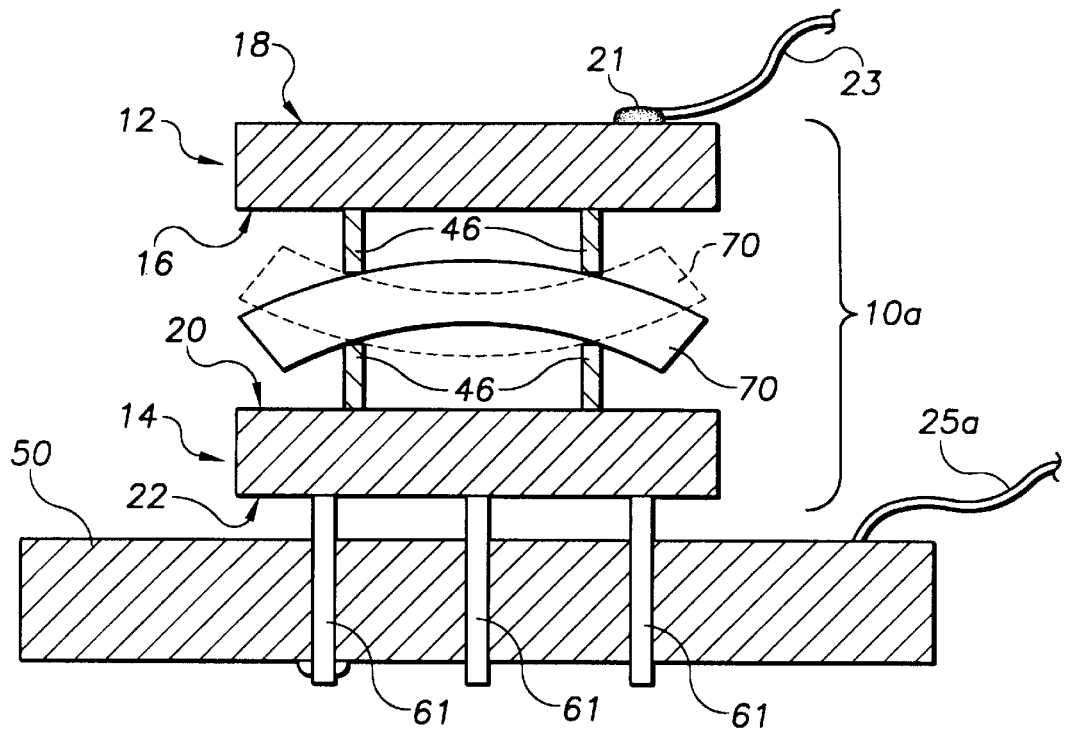
FIG. 4 is a cross-sectional view of one embodiment of the contact device of the present invention suitable for use and mounting upon a circuit board.

As mentioned hereinabove, a common problem with multi-layer, parallel-poled piezoelectric transformers is the difficulty with securing them to circuit boards. As shown in FIG. 4, by using a modified contact device 10b of the present invention, this is a relatively simple matter. As shown in FIG. 4, multi-layer, parallel-poled piezoelectric transformer 70 is incorporated into circuit board 50 through a relatively simple modification of the lead attachment system described hereinabove. In this case, first surface 20 of lead attachment plate 14 has legs 46 extending therefrom to form the contact with the node(s) of the transformer 70. Second surface 22, however, has one or more leads 61 attached thereto that are suitable for insertion into circuit board 50. Lead 61 may be attached to the circuit board 50 by solder, thus providing both an electrically conductive path between wire lead 25a and the transformer 70 (via circuit board 50, to lead 61, to contact plate 14, thence to leg(s) 46) and an effective method for supporting the transformer 70. Lead 61 could, of course, comprise a pin suitable for insertion into circuit board 50.

There has, thus, been described a simple yet effective device for reliably securing contact leads to multi-layer, parallel-poled piezoelectric transformer 70.

From the foregoing description, one skilled in the art can easily ascertain the essential characteristics of this invention, and without departing from the spirit and scope thereof, make various changes and modifications of the invention to adapt it to various usages and conditions. It is therefore intended that the scope of the invention is limited only by the scope of the appended claims.

What is claimed is:

1. A packaged piezoelectric transformer, comprising:
 a multi-layer piezoelectric transformer;
    said multi-layer piezoelectric transformer having a first piezoelectric ceramic wafer with first and second opposing electroded major faces and polarized normal to said first and second opposing electroded major faces;
    said second opposing major face of said first piezoelectric ceramic wafer having a circular node thereon;
    said multi-layer piezoelectric transformer having a second piezoelectric ceramic wafer with first and second opposing electroded major faces and polarized normal to said first and second opposing electroded major faces;
    said second opposing major face of said second piezoelectric ceramic wafer having a circular node thereon;
    said multi-layer piezoelectric transformer having an intermediate electrode layer bonded to said first major face of said first piezoelectric ceramic wafer and to said first major face of said second piezoelectric ceramic wafer;
 a first conductive lead attachment plate having a first surface and a second surface, said first surface having a first leg having a circular segment footprint extending therefrom adapted to contact said circular node on said second opposing major face of said first piezoelectric ceramic layer; and
 a second conductive lead attachment plate having a first surface and a second surface, said first surface having a second leg having a circular segment footprint extending therefrom adapted to contact said circular node on said second opposing major face of said second piezoelectric ceramic layer;
 said second surfaces of each of said first and second conductive lead attachment plates being sufficient to permit attachment of electrical leads thereto.

2. The packaged piezoelectric transformer of claim 1, wherein said first and second conductive lead attachment plates are round.

3. The packaged piezoelectric transformer of claim 2, further comprising:
 a first electrical lead attached to one of said second surfaces.

4. The packaged piezoelectric transformer of claim 3, further comprising:
 at least one circuit board mountable electrode extending from the second surface of one of said conductive lead attachment plates.

5. The packaged piezoelectric transformer of claim 3, further comprising:
 a second electrical lead attached to the second surface of the other conductive lead attachment plate.

6. The packaged piezoelectric transformer of claim 3, wherein said first circular leg is bonded to said first circular node;

and wherein said second circular leg is bonded to said second circular node.

7. The packaged piezoelectric transformer of claim 3, further comprising:

means for applying pressure to said first and second conductive lead attachment plates such that said first circular leg applies pressure to said first circular node and said second circular leg applies pressure to said second circular node.

* * * * *